United States Patent [19]

Idstein

[11] Patent Number: 4,493,123
[45] Date of Patent: Jan. 15, 1985

[54] PRESSURE-CONTACT AND LIFT-OFF ARRANGEMENT

[75] Inventor: Hermann Idstein, Oestrich-Winkel, Fed. Rep. of Germany

[73] Assignee: Hoechst Aktiengesellschaft, Frankfurt am Main, Fed. Rep. of Germany

[21] Appl. No.: 552,775

[22] Filed: Nov. 17, 1983

[30] Foreign Application Priority Data

Nov. 26, 1982 [DE] Fed. Rep. of Germany ....... 3243874

[51] Int. Cl.$^3$ .............................................. G03D 5/06
[52] U.S. Cl. .......................................... 15/4; 15/77; 354/317
[58] Field of Search ............... 15/77, 88, 102, 4, 93 R; 354/297, 317–322

[56] References Cited

U.S. PATENT DOCUMENTS 3,449,781  6/1969  French et al. ........................ 15/77
3,846,816  11/1974 Gaisser .
4,206,527  6/1980  Diels et al. .
4,222,656  9/1980  Harrell et al. ...................... 354/317
4,349,932  9/1982  Schoernig ........................... 15/77

FOREIGN PATENT DOCUMENTS 2326122 12/1973 Fed. Rep. of Germany .
2336122  2/1974 Fed. Rep. of Germany .

OTHER PUBLICATIONS

European Search Report.

Primary Examiner—Edward L. Roberts
Attorney, Agent, or Firm—Schwartz, Jeffery, Schwaab, Mack, Blumenthal & Koch

[57] ABSTRACT

The invention relates to a pressure-contact and lift-off arrangement, which comprises pressure-rollers, a doctor blade, and brushes, which are mounted in guide rails or bearings, as appropriate. These rails or bearings are located on the inner sides of the side plates of a processing unit. Hold-downs are mounted on supporting frames in a manner permitting vertical adjustment by means of screws. The supporting frames have elongated holes which are obliquely inclined, and are capable of displacement in the longitudinal direction over bearing carriers on which rolling-contact bearings seat. The bearing carriers are fastened to the side plates by means of screws. The supporting frames are connected by means of a shaft, which possesses hubs and on which a hand lever acts. The hubs are connected to link plates by means of attachment screws. Connecting links are mounted on these link plates by means of bolts which are capable of rotating. The connecting links are articulated to the supporting frames by means of screw-bolts. The supporting frames carry lift-off stirrups with cutouts for the drive rollers, and for the brushes. In the working position, the hold-downs press the pressure rollers, the doctor blade, and the brushes against a pressure plate, or against the surface of a table, over which the printing plate is guided.

14 Claims, 7 Drawing Figures

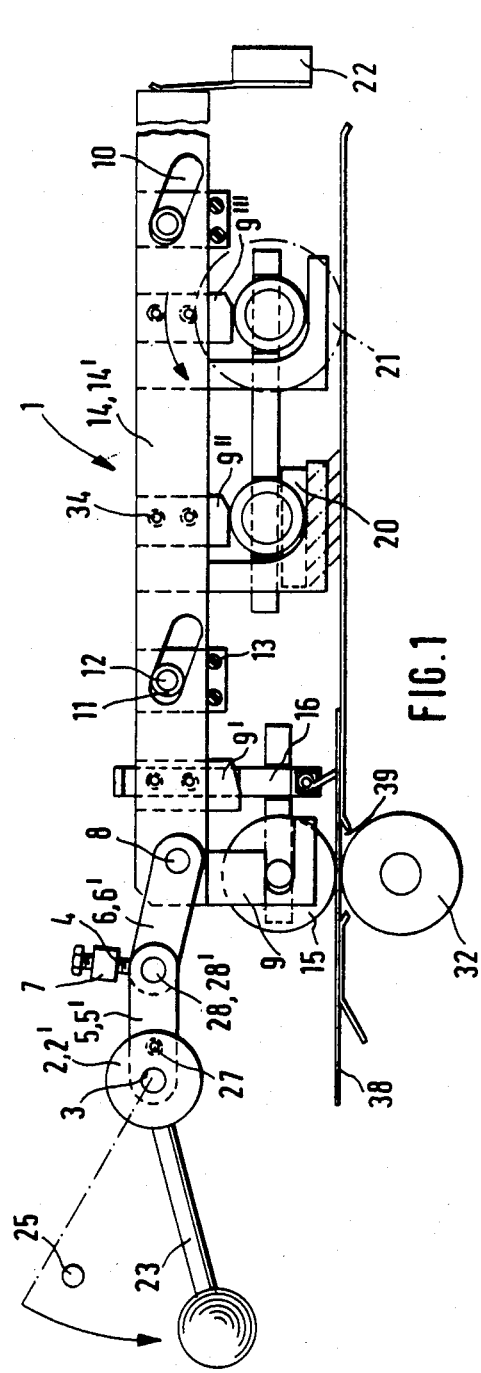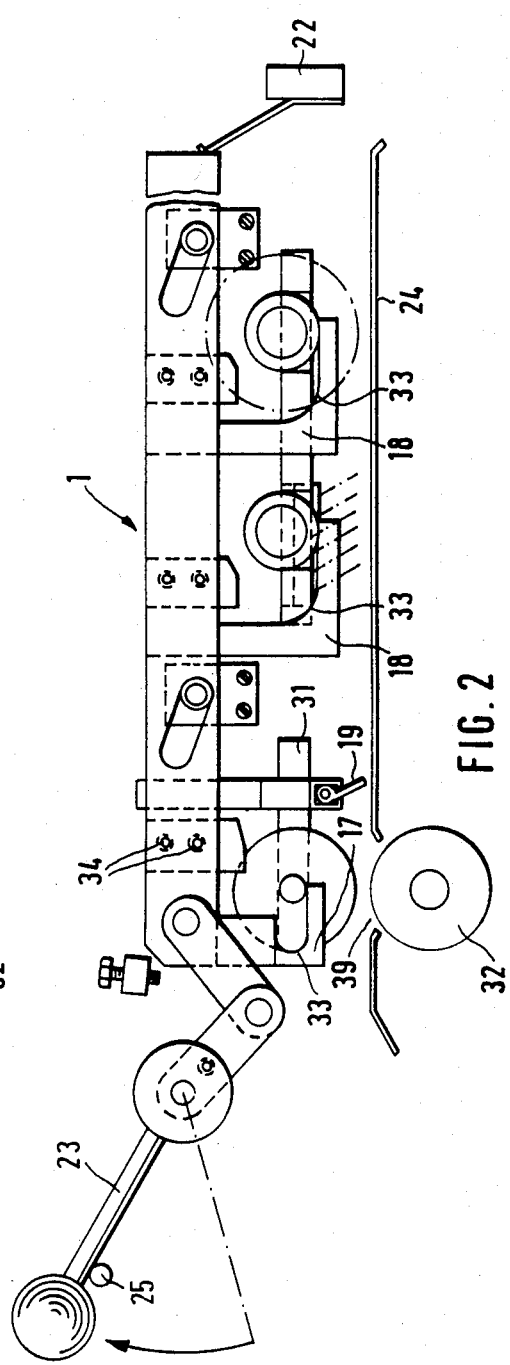

PRESSURE-CONTACT AND LIFT-OFF ARRANGEMENT

BACKGROUND OF THE INVENTION

The invention relates to a pressure-contact and lift-off arrangment for working elements which are sequentially arranged in a processing unit for exposed printing materials, wherein the print materials are guided, in continuous succession, across the surface of a table, where they are developed and cleaned.

In processing units for printing plates, papers or films with photosensitive coatings, or similar materials which are developed after exposure to produce an image, transport devices and squeezing-off devices are provided. These devices generally comprise two rollers which can be pressed against one another, and which simultaneously effect the forward transportation of the printing plates. The rollers also squeeze off excess liquid developer, or any other chemicals which may be used in the developing process, as well as squeeze off the cleaning fluid from both sides of the printing material. Viewed in the direction in which the printing materials are transported through the processing unit, doctor-blade devices are frequently installed in advance of and/or following the transport and squeezing-off devices. These doctor blades wipe off any residual amounts of liquid which may still be present in advance of and following the individual processing stations. In this manner, the doctor blades prevent each liquid in question from being dragged into a processing station located downline.

The rotating and oscillating brushes which are installed within the developing station assist the developing process to which the printing plate is being subjected, in conjunction with the simultaneous action of a cleaning fluid.

In practice, each of these working elements is mounted individually (German Offenlegungsschrift No. 2,336,122), and is also individually pressed against the printing materials which runs across the surface of the table. No arrangements are provided for the simultaneous, slight lifting of all the working elements from the contact surface, or for the simultaneous lifting of all the elements clear of the surface. Means are only provided for lifting the working elements individually, either slightly from the surface or clear of it.

In the case of the foregoing arrangement, since a separate control handle is assigned to each end of each upper roller, in order to lift off the upper rollers, as is necessary before comparatively long shutdown periods, for example overnight, or during a weekend, disadvantageously, a large number of control handles must be operated. The operation of these handles is convenient and time-consuming, so that operators are occasionally tempted to neglect these control actions. If, however, the rollers remain pressed against one another over comparatively long shutdown times, deformation of their surfaces can occur. Such deformation can endanger the reliability and gentleness of the transportation of the printing plates, as well as endanger the degree of perfection of the process whereby the liquids are squeezed-off, above all in the case of horizontal processing systems.

The state of the art likewise includes an arrangement for developing printing plates in which rollers are installed in pairs with their ends mounted in side plates. These side plates are divided such that their complete upper portion or, as the case may be, the complete upper portion of the processing zone including all the upper rollers, can be lifted slightly by means of a pivot point which is assigned to the upper side plate. The side plates are equipped with appropriate lifting elements in order to permit this function to be performed.

This arrangement is comparatively expensive and obliges the operator to exert considerable force. This arrangement cannot be used for facilities of the type which have a plurality of treatment stations, and in which each treatment station is designed as a constructional unit which can be assembled with further constructional units to form the complete facility.

U.S. Pat. No. 3,846,816 discloses a processing facility for printing plates which possesses a stationary lower portion and an upper portion which can be tilted relative to the lower portion about a horizontal axis. An electrically-operated screw type lifting device is fastened to the upper portion to lift or lower it as required. The lifting device is connected to switching devices which react to pressure and which are attached to both portions of the processing appliance. Rollers are mounted in the upper portion, these rollers being raised with this upper portion when it is tilted away. In the case of this appliance, it is disadvantageous that the various liquids can drip from the rollers into the adjacent processing stations, since the upper portion does not remain parallel on being lifted slightly from the lower portion. The upper portion is only hinged, and thus moves upward at an angle. Moreover, opening the processing appliance results in more rapid evaporation of the developer.

U.S. Pat. No. 4,206,527 discloses a printing plate developing facility having upper and lower rollers for transporting the printing plates. These rollers are arranged horizontally in pairs and squeeze off any residual liquid adhering to the printing plates. At each end, each upper pressure roller possesses a bearing which is installed in a manner such that it can be raised and lowered in relation to the lower roller, and which is moved by means of a toggle-lever arrangement. The bearings of the upper rollers are moved, in each case, by means of a pivotable fork head having an upper arm and a lower arm. The pivot axis of the fork head is aligned in a manner such that it is parallel to the direction in which the printing plates are transported. When the bearing is in the lowered state, the toggle-lever arrangement presses the upper arm downward, onto the bearing, while in the raised state the bearing is supported by the lower arm. A first end of each toggle-lever arrangement is connected to the fork head, and a second end of each toggle-lever arrangement is connected to a rotatable control shaft which is common to all the toggle-lever arrangements, and which is mounted parallel to the direction in which the printing plates are transported.

When the pressure rollers are unloaded, but have not been lifted clear, dried-on cleaning fluid and/or gumming residues generally lead to patches of adhesion in the region of the roller gap. Adhesions of this nature can cause damage to the surfaces of the rollers, and of the printing material. It is also disadvantageous that the doctor-blade device can become glued to the surface against which it bears as a result of the drying-on of decoating fluid. This can lead to damage of the lip of the doctor blade in the process of removing the doctor-blade device, or when the next printing plates run through the unit. If the processing unit contains oscillating brushes and/or rotating brushes as working elements, a problem occurs if the bristles of the brushes are not raised when the unit is shut down overnight, or during the weekend, and remain under load. In this situation, the bristles, which are pressed against the contact surface, cannot spring back again into their unloaded starting position. This results in a shortening of the useful life of the bristles as compared to the case where the brushes are raised. Moreover, the deformation experienced by the bristles adversely affects the operational reliability of the brushes.

SUMMARY OF THE INVENTION

An object of the present invention is to provide a pressure-contact and lift-off arrangement for a processing unit for printing materials.

A further object of the present invention is to provide a contact and lift-off arrangement in which the chemicals used for development, cleaning, and/or gumming are able to drip from the working elements, such as rollers, doctor blades, and brushes, without leaving any residue.

Another object of the present invention is to provide a contact and lift-off arrangement in which it is not necessary to remove the working elements from the unit after a working cycle to clean the elements.

Yet another object of the present invention is to provide a contact and lift-off arrangement which, in the operative position, produces a positive contact pressure and which, in the inoperative position, allows the individual working elements to be freely removed, if necessary, and releases the working elements.

In accomplishing the foregoing objects, there has been provided in accordance with the present invention a pressure-contact and lift-off arrangement for working elements which are sequentially arranged in a processing unit for exposed printing materials. The unit includes a table surface on which the printing materials are guided in continuous succession where they are developed and cleaned. The arrangement comprises side plates between which the working elements are located, and guide members located on inner sides of the side plates. The working elements have ends supported, respectively, in the guide members. Supporting frames are positioned on opposite sides, respectively, of the working elements. The supporting frames have elongated guide holes formed therein at an angle with respect to said table surface. Hold down members are associated, respectively, with the guide members. The hold down members are connected to the supporting frames and are positioned above the working elements. Bearing members are connected to the side plates and are received in the holes, respectively, for guiding movement of the supporting frames between a raised position and a lowered position with respect to the side plates.

In accordance with other aspects, the invention includes a table having a surface on which printing materials are guided in continuous succession for developing and cleaning. A plurality of working elements sequentially arranged along the table surface for acting on printing materials being guided along the table surface, and a pair of spaced stationary side plates, the working elements being positioned between the side plates. Supporting frames are positioned on opposite sides of the working elements and are connected to the side plates by means restricting movement of the supporting frames to a path inclined upwardly from the table surface. Means are mounted to the side plates for guiding movement of the working elements in a vertical path. Means are mounted on the supporting frames for lifting the working elements from an operative position to an inoperative position along the vertical path as the supporting means moves along the inclined path.

Further objects, features and advantages of the present invention will become apparent from the detailed description of preferred embodiments which follows, when considered together with the attached figures of drawings.

BRIEF DESCRIPTION OF THE DRAWINGS

In the text which follows, the invention is explained in more detail by references to an illustrative embodiment which is represented in the attached drawings, in which:

FIG. 1 is a diagrammatic overall view of the contact-pressure and lift-off arrangement according to the invention in the position in which the working elements are exerting pressure, FIG. 2 is a diagrammatic overall view of the contact-pressure and lift-off arrangement according to FIG. 1 in the lifted-off, inoperative position.

DETAILED DESCRIPTION OF THE PREFERRED EMBODIMENTS

Figure 3:
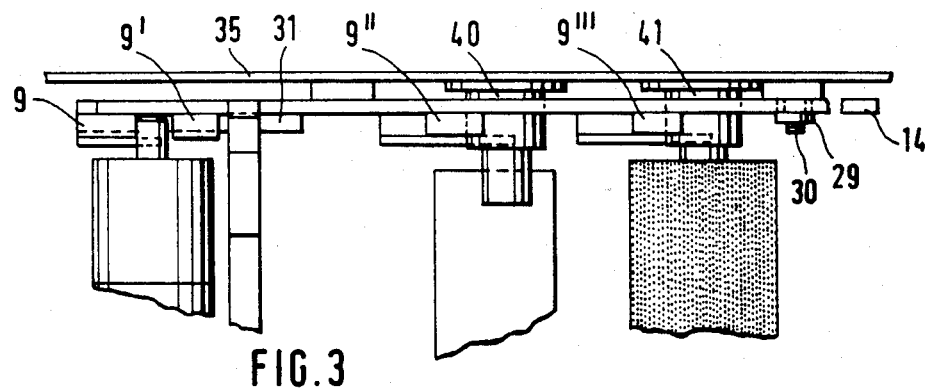
FIG. 3 is a partial plan view of the contact-pressure and lift-off arrangement according to the invention.

The present invention comprises working elements located between side plates. The working elements are mounted by journal-ends or shaft-ends in guide rails or bearings, as appropriate. These rails or bearings are located on the inner sides of the side plates. A hold-down is assigned to each journal-end, or shaft-end, of a working element. These hold-downs are situated above the working element and are fastened in a manner permitting vertical adjustment to one of the supporting frames which are present on either side of the working elements. The supporting frames have elongated holes which run at an angle and into which bearing carriers engage. These bearing carriers are connected to the side plates by means of attachment bolts.

The supporting frames may be interconnected by means of a shaft. A hub seats on each end of the shaft in a manner such that twisting cannot take place. A pivotable hand lever is fastened to at least one of the hubs. It is also possible, of course, for a hand lever to be fixed to each of the hubs. Link plates are connected to the two hubs by means of attachment screws. Connecting links are mounted on the link plates by means of bolts which are capable of rotating. These connecting links are articulated to the supporting frames by means of screwbolts. At the same time, the pivoting movement of the hand lever is converted into a rotation of the link plates and of the connecting links about the shaft. This rotation initiates a forcible displacement of the supporting frames. This forcible displacement of the supporting frames initiates their movement at an angle by means of the inclined elongated holes which form inclined planes for a rolling movement at positionally fixed rolling-contact bearings which seat on the bearing carriers inside the elongated holes.

The invention achieves the following advantages. All the pressure rollers are unloaded by means of a centrally-operable control device, and can be brought clear of the transport rollers which are located underneath them. As a result, the possibility of out-of-round patches on the surfaces of the rollers, which could result from permanent deformation, is excluded since the surfaces of the rollers are at all times separated when the processing unit is inoperative. In the case of pressure rollers of known contact-pressure systems, which rollers are unloaded, but which are not raised clear, dried-on cleaning and/or gumming residues lead to patches of adhesion in the gap regions between the pressure rollers and the transport rollers and can be the cause of damage to the surfaces of the rollers, and to the surfaces of the printing material.

It is also advantageous that the pressure of the doctor blade against the surface of the printing material be established automatically. Automatic lifting of the doctor blade from the contact surface is likewise advantageous. As a result of the doctor blade being lifted, the possibility of adhesion of the lip of the doctor blade to the contact surface is excluded. The forcibly controlled lifting of the doctor blade on switching off the processing unit also prevents the lip of the blade from being permanently deformed. As a result of the slight lifting of the oscillating and/or rotating brushes, the bristles are unloaded while the unit is shut down so that the individual bristles can spring back again into their starting position. As a result, the brushes exhibit a considerably longer useful life than those in known processing units and, moreover, their operational reliability also increases, since the bristles are not permanently deformed.

It is also an advantage that time-consuming adjustment operations on the processing unit can, to a substantial extent, be omitted, since the working elements of the contact-pressure and lift-off arrangement can be assembled and initially adjusted outside the processing unit, and do not require readjustment. The pressure exerted by the individual working elements on the contact surface or, as the case may be, on the printing materials which are being transported across this surface, can be adjusted to suit the requirements which are necessary in any given case, these adjustments being simple to carry out.

As a result of lifting-off all the working elements, clear of the contact surface, the remaining chemicals drip from the working elements without leaving residues so that cleaning between the individual processing operations which take place at defined time intervals, is substantially dispensed with, as a result of which the cost of maintenance is considerably reduced.

FIG. 1 shows a side view of a contact-pressure and lift-off arrangement 1 in the working position. In this position, the working elements, such as the pressure roller 15, doctor blade 16, and brushes 20 and 21, which are sequentially arranged between supporting frames 14 and 14' (compare FIG. 4), bear against a printing material or, as the case may be, against the surface 24 of a table, which surface serves as a supporting surface for the printing material. The printing material may be, for example, a printing plate 38, which is running through.

The contact-pressure and lift-off arrangement 1 is a component of a processing unit for exposed printing materials. The printing materials are guided in continuous succession across the surface 24 of a table where they are developed and cleaned, and, in some cases, gummed. In general, several processing stations with transport rollers and pressure rollers are provided along the length of the surface 24 of the table. These rollers are installed in pairs; only a single pair is represented in the drawings. Each pair of rollers comprises a pressure roller 15 and a transport roller 32 located opposite the pressure roller 15. The transport roller 32 protrudes into the surface 24 of the table through an aperture 39. In the working position, the pressure roller 15 is pressed against the transport roller 32, while in the inoperative position the pressure-roller 15 is lifted clear of the transport roller 32. The supporting frames 14, 14' are interconnected by means of a shaft 3, on each end-face of which a hub 2, 2' seats in a manner such that twisting cannot take place. A pivotable hand lever 23 is fastened to at least one of the hubs 2, or as the case may be 2'. Instead of a single hand lever 23, it is also possible for two hand levers to be provided, one being attached to each hub, and being interconnected by the shaft 3.

Link plates 5, 5' are installed on the two hubs 2, 2' by means of attachment screws 27, 27'. Connecting links 6, 6' are mounted on the right-hand ends of the link plates 5, 5' in FIG. 1, by means of two bolts 28, 28', which are capable of rotating. Connecting links 6, 6' are articulated to the supporting frames 14, 14' by means of screw-bolts 8, 8'. Together with the connecting links 6, 6', the link plates 5, 5' form a toggle lever, which can be pivoted and flexed at the pivot-points of the bolts 28, 28'. In FIG. 1, when the hand lever 23 is swung downward, this toggle lever is flexed upward by a small amount, so that the two bolts 28, 28' bear against screws 4, 4' which serve as stops and which enable adjustments to be carried out. Screws 4, 4' are mounted in counter-supports 7, 7' on the side plates 35, 35'. The upward-flexed toggle lever is held in this position by the restoring force exerted by the working elements, 15, 16, 20 and 21, which are pressed against the surface 24 of the table.

In this locked position, the individual hold-downs 9, 9', 9'' and 9''', which are fastened to the supporting frames 14 and 14', respectively, in a manner permitting adjustment, press the various working elements, such as the pressure roller 15, the doctor blade 16, and the brushes 20, 21 into the working position. The hold-downs 9, 9', 9'' and 9''' are fastened to the inner sides of the supporting frames 14, 14' by means of screws 34.

The doctor blade 16 is installed following the pressure roller 15. Doctor blade 16 contains a lip 19 which bears obliquely against the surface of the printing plate 38. The doctor blade 16 is followed by a brush 20 and then by a brush 21. The brush 20 is, for example, an oscillating brush, while the brush 21 is a rotating brush. The sequence of brushes can also be reversed, or a further rotating brush can be provided in place of the oscillating brush.

In practice, still more pairs of rollers and doctor blades are present, in addition to the working elements which are represented. However, for the sake of greater clarity, these additional elements are not included in the drawings.

The supporting frames 14, 14' contain a number of elongated holes 10 which are obliquely inclined. Bearing carriers 12 are received in these holes 10 and are penetrated by attachment bolts 30 (compare FIG. 4). The working elements 15, 16, 20 and 21 are located between the side plates 35, 35' and are mounted by the journal-ends 26 or shaft-ends in guide rails 31 or bearings 40, 41, as appropriate. These rails or bearings are located on the inner sides of the side plates 35, 35'. The adjustable hold-downs 9, 9', 9" and 9"' which are installed on the supporting frames 14, 14' are situated above the ends of the journals, or shafts, of the working elements.

The bearing carriers 12 are fastened to the side plates 35, 35' by means of screws 13. Rolling-contact bearings 11 seat on the bearing carriers 12. These bearings 11 enable the elongated inclined holes 10 to be shifted in the longitudinal direction. The supporting frames 14, 14' are secured with respect to axial shifting by means of stop-washers 29 and attachment bolts 30 (compare FIG. 3).

Lift-off stirrups 17 for the pressure roller 15, and lift-off stirrups 18 for the brushes 20, 21, are fastened to the supporting frames 14, 14'. The lift-off stirrups have cutouts 33 which are rounded-off. The lower limbs of these cutouts are located, when in the working position, a short distance from the journal-ends or shaft-ends of the pressure roller 15 and of the brushes 20, 21, respectively.

FIG. 2 shows the inoperative position of the contact-pressure and lift-off arrangement 1, in which position the hand lever 23 has been swung upward, and is locked by means of a spring-loaded positioning pin, against which the lower edge of the hand lever 23 bears. On changing-over from the inoperative position, to the working position, it is first necessary to unlatch this positioning pin 25, before the hand lever 23 can be pushed down. In the inoperative position, the working elements are lifted clear of the surface 24 of the table, and are positioned at a distance from this surface such that residual chemicals can drip from the working elements without any hindrance. The lifting of the working elements ensures that neither the lip 19 of the doctor blade becomes glued to the surface 24 of the table, nor the gap between the pressure roller 15 and the transport roller 32 becomes clogged. In addition, the bristles of the brushes 20 and 21 are prevented from becoming stuck together, and from being deformed as a result of bearing against the surface 24 of the table.

The end surface of one of the supporting frames is in contact with a control switch 22 which is switched on or off in accordance with the position of the supporting frames. When the supporting frames 14, 14' are in the inoperative position, as represented in FIG. 2, the control switch is opened, thus stopping the working elements from being brought into operation since their drive source is switched off.

The plan view, provided in FIG. 3, represents the manner in which the working elements are mounted in the guide rails 31 and in the bearings 40, 41, as well as showing the hold-downs 9 to 9"'.

Figure 4:
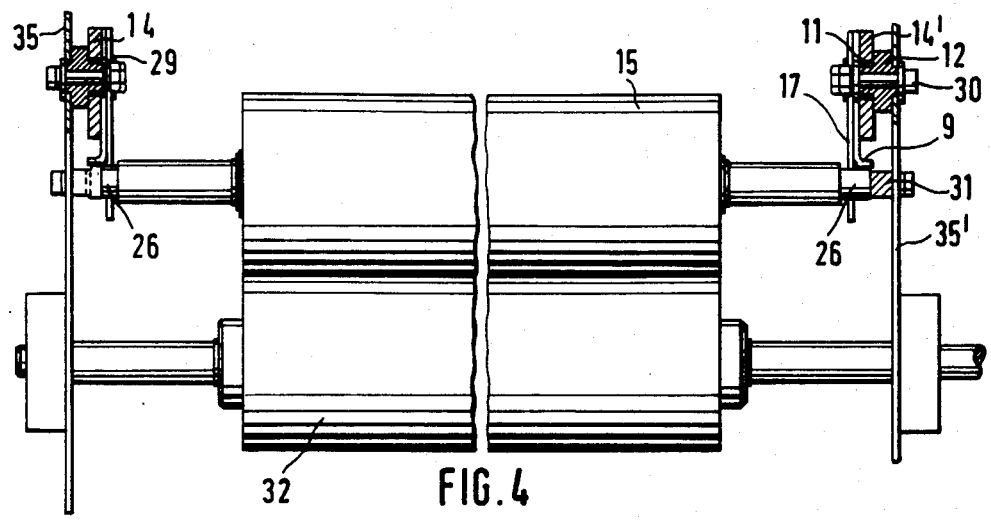
FIG. 4 is a sectional view of the pressure rollers and transport rollers, and of the manner in which they are mounted in the side plates of the contact-pressure and lift-off arrangement.

FIG. 4 shows a partial view of the contact-pressure and lift-off arrangement 1, namely, of the pressure roller 15 and the transport roller 32, in the working position, in which the rollers are pressed against one another. The transport roller 32 is mounted by the ends of its shafts in bearing shells. The bearing shells, are not specifically marked, but are located on the outer surfaces of the side plates 35, 35'. The shaft of the transport roller 32 is extended beyond the right-hand side plate 35' to a drive motor which is also not included in the drawing.

The journal-ends 26 of the pressure roller 15 are mounted in the guide rails 31, which are fastened to the insides of the side plates 35, 35'. The angled-over end of each of the hold-downs 9 and, in the working position, the cutout 33 in the lift-off stirrup 17, surrounds the journal-end 26, as can be seen from FIG. 5. The attachment bolts 30 pass through the bearing carrier 12, and are secured with respect to axial displacement by means of nuts on the insides of the supporting frames 14, 14'.

Figure 5:
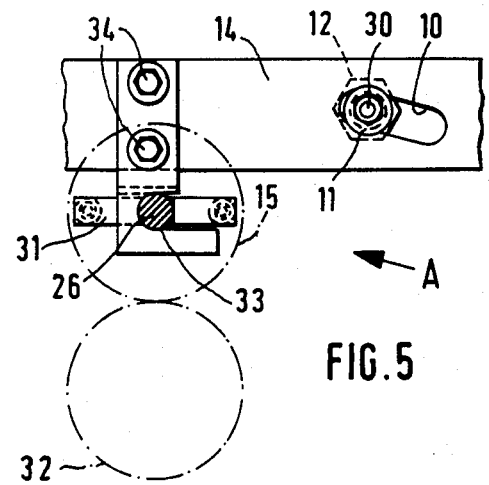
FIGS. 5 and 6 are details in a cutout of the contact-pressure and lift-off arrangement, in the region of the pressure and transport roller, in the working position of the arrangement, and in its inoperative position.
Figure 6:
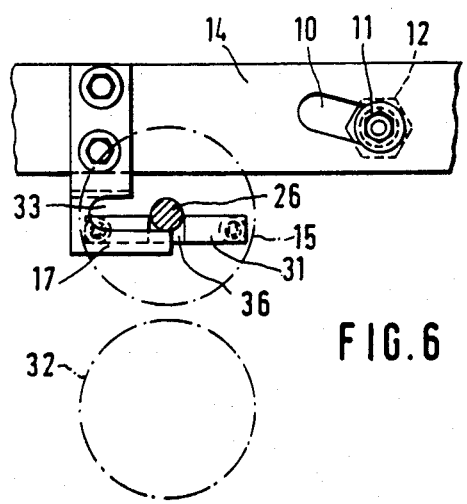

FIGS. 5 and 6 show details of the bearing of the pressure roller 15, in the working position of the contact-pressure and lift-off arrangement 1 (see FIG. 5), and in its inoperative position (see FIG. 6).

As can be seen from FIG. 5, when in the working position, the cutout 33 surrounds the whole of the journal-end 26 of the pressure roller, the lower limb being situated a short distance from the journal-end 26. The bearing carrier 12, with the rolling-contact bearing 11 seated on it, is positioned at the upper end of the elongated hole 10.

In the inoperative position, represented in FIG. 6, the supporting frame 14 is moved in the direction indicated by the arrow A in FIG. 5, upward and from right to left, so that the bearing carrier 12, together with the rolling-contact bearing 11 seated on it, is now positioned at the lower end of the elongated hole 10. As a result of this movement, the lift-off stirrup 17 is displaced obliquely upward, causing its lower limb to lift the journal-end 26 out of a guide slot 36 in the guide rail 31, and hence causing a gap to form between the pressure roller 15 and the transport roller 32.

Figure 3A:
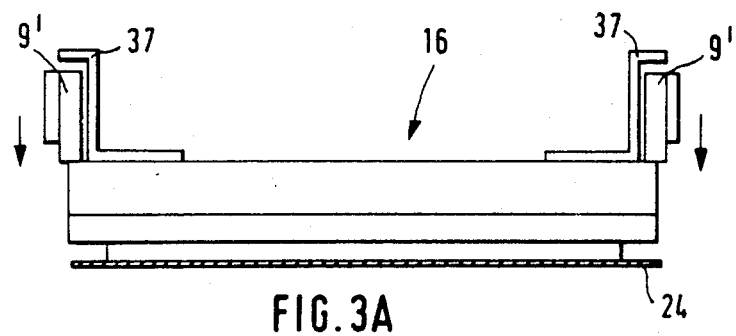
FIG. 3A is a view of a doctor blade of the contact-pressure and lift-off arrangement.

An angle plate 37 is fastened as an overlapping piece to the top of the doctor blade 16 (FIG. 3A). The top of the supporting frame 14,14' bears against the horizontal leg of this angle plate 37 as the contact-pressure and lift-off arrangement 1 starts to be lifted, lifting the doctor blade 16 from the surface 24 of the table.

The mode of operation of the pressure-contact and lift-off arrangement 1 is as follows.

In the starting position, the journal-ends or, as the case may be, the shaft-ends of the pressure roller 15, the doctor blade 16, and the brushes 20, 21, are inserted into the guide rails 31 of the processing unit. The pressure-contact and lift-off arrangement 1 is brought into its operating position by following a procedure whereby the operator first unlatches the positioning pin 25, this pin 25 being necessary in order to lock the arrangement in the inoperative position. Subsequent pushing-down of the hand lever 23 causes the hubs 2 and 2', articulated thereto, to rotate. The rotation, thus initiated, forcibly displaces the supporting frames 14, 14' towards the right, as shown in FIG. 1. The longitudinal displacement of the supporting frames 14, 14' causes them to move obliquely downward, from left to right, with the hold-downs 9, 9', 9", 9"' which are fastened on them, and with the lift-off stirrups 17 and 18. This oblique movement takes place over the obliquely inclined elongated holes 10 as a result of rolling at the rolling-contact bearings 11. In the working position, the pressure roller 15 bears against the transport roller 32 or, as the case may be, against the surface of the printing material, such as the printing plate 38, which is positioned, at just that moment, in the gap between the pressure roller 15 and the transport roller 32. Furthermore, the lip 19 of the doctor blade is pressed against the surface of the printing plate 38 or, as the case may be, against the surface 24 of the table over which the printing plate 38 is guided, as are the bristles of the brushes 20 and 21.

The pressure-contact and lift-off arrangement 1 is brought into the inoperative position by raising the hand lever 23, which causes the supporting frames 14, 14' to be moved upward, from right to left. At the same time, the spring-loaded positioning pin 25 is pushed in, which subsequently secures the final position of the hand lever 23 to prevent it from swinging down.

During the upward movement of the hand lever 23, the lift-off stirrups 17 and 18, which are fastened to the supporting frames 14, 14', are also lifted, and bring the various working elements, such as the pressure roller 15, the doctor blade 16, and the brushes 20 and 21, clear of the surfaces on which they rest. Once the lifting movement of the supporting frames 14, 14', upward and towards the left is completed, the hold-downs 9, 9', 9" and 9''' release the ends of all the working elements on which they have been pressing, and enable these elements to be removed easily in the vertical direction. In this position, the control switch 22, which has opened, prevents the working elements from being put into motion, and thereby excludes any possibility of incorrect operation of the processing unit.

If a setting gage is used, it is possible to assemble the two supporting frames, 14, 14', together with all the hold-downs, 9, 9', 9" and 9''' and lift-off stirrups 17 and 18, outside the processing unit, and to effect their initial adjustment, thus enabling time-consuming adjustment operations on the processing unit to be largely dispensed with.

The foregoing example is set forth to illustrate the present invention but should not be deemed to limit the scope thereof. Clearly, numerous additions, substitutions and other modifications can be made to the invention without departing from the scope thereof as set forth in the appended claims.

What is claimed is:

1. A pressure-contact and lift-off arrangement for working elements which are sequentially arranged in a processing unit for exposed printing materials, said unit including a table surface and wherein said printing materials are guided in continuous succession across said table surface where they are developed and cleaned, said arrangement comprising:
   side plates, said working elements being located between said side plates;
   guide members located on inner sides of said side plates, said working elements having ends supported, respectively, in said guide members;
   supporting frames positioned on opposite sides, respectively, of said working elements, said supporting frames having elongated guide holes formed therein at an angle with respect to said table surface;
   hold down members associated, respectively, with said guide members, said hold down members being connected to said supporting frames and positioned above said working elements;
   bearing members connected to said side plates and received in said holes, respectively, for guiding movement of said supporting frames between a raised position and a lowered position with respect to said side plates; and
   means for raising and lowering said working elements in response to movement of said supporting frames guided by said holes.

2. An arrangement as set forth in claim 1, including means for adjusting the position of said hold down members on said supporting frames.

3. An arrangement as set forth in claim 1, including a shaft, hubs mounted on end surfaces of said shaft, and a lever mounted to at least one of said hubs for rotating said shaft through said at least one hub, and means for interconnecting said hubs and said supporting frames for moving said supporting frames along said holes in response to movement of said lever.

4. An arrangement as set forth in claim 3, wherein said interconnecting means comprises link plates connected to said two hubs and connecting links mounted on said link plates and articulated to said supporting frames whereby pivoting movement of said lever is converted into a rotation of said link plates and of said connecting links about said shaft and wherein this rotation produces said movement of said supporting frames.

5. An arrangement as set forth in claim 3, including means for locking said lever in an inoperative position in which said supporting frames are raised.

6. An arrangement as set forth in claim 5, wherein said locking means comprises a spring loaded positioning pin against which a lower edge of said lever bears in the inoperative position.

7. An arrangement as set forth in claim 3, wherein said interconnecting means comprises a toggle lever attached between said hubs and said supporting frames, said toggle lever containing pivot points for enabling said toggle lever to flex, and including means for stopping said toggle lever, said stop means comprising an adjustable screw mounted to one of said side plates.

8. An arrangement as set forth in claim 3, including a control switch positioned for actuation by one of said supporting frames for producing a signal indicative of the position of said one of said supporting frames.

9. An arrangement as set forth in claim 8, including means mounted to said supporting frames for applying a downward force to said working elements when said working elements are in said operative position.

10. An arrangement as set forth in claim 1, wherein said means for raising and lowering said working elements comprises lift off stirrups for said working elements, said lift off stirrups being connected to said supporting frames and having rounded cutouts against which said ends of said working elements bear, respectively, when said arrangement is in said lowered position.

11. An arrangement as set forth in claim 1, wherein said working elements comprise a pressure roller, a doctor blade, and brushes which, in the lowered position, are pressed down by said hold down members.

12. In a processing unit for exposed printing materials,
   a table having a surface on which printing materials are guided in continuous succession for developing and cleaning;
   a plurality of working elements sequentially arranged along said table surface for acting on printing materials being guided along said table surface;
   a pair of spaced stationary side plates, said working elements being positioned between said side plates;
   supporting frames positioned on opposite sides of said working elements;
   means interconnecting said supporting frames and said side plates for restricting movement of said supporting frames to a path inclined upwardly from said table surface;
   means mounted to said side plates for guiding movement of said working elements in a vertical path;

means mounted on said supporting frames for lifting said working elements from an operative position to an inoperative position along said vertical path as said supporting means moves along said inclined path.

13. An arrangement as set forth in claim 12, wherein said means for applying a downward force comprises a plurality of hold down members positioned, respectively, above said working elements when said working elements are in said operative position, said hold down members being moved laterally of said working elements in response to movement of said supporting frames.

14. An arrangement as set forth in claim 12, wherein said interconnecting means comprises a cam surface on one of said side plates and said supporting frames, and a cam follower on the other of said side plates and said supporting frames.

* * * * *